(12) United States Patent
Thomsen

(10) Patent No.: US 6,639,411 B1
(45) Date of Patent: Oct. 28, 2003

(54) MICROACTUATED SUSPENSION MOTOR FAILURE DETECTION SYSTEM

(75) Inventor: Jeffrey E. Thomsen, Cosmos, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 93 days.

(21) Appl. No.: 09/941,477

(22) Filed: Aug. 29, 2001

Related U.S. Application Data

(60) Provisional application No. 60/230,029, filed on Sep. 5, 2000.

(51) Int. Cl.$^7$ ............................................... G01R 33/00

(52) U.S. Cl. ........................................ 324/537; 324/772

(58) Field of Search ........................... 360/294.4, 294.3; 324/158.1, 537, 545, 546, 772, 727

(56) References Cited

U.S. PATENT DOCUMENTS

| | | | | |
|---|---|---|---|---|
| 3,861,025 A | * | 1/1975 | Sims ........................... | 29/593 |
| 4,801,877 A | * | 1/1989 | Herrick et al. ............... | 324/772 |
| 5,862,015 A | * | 1/1999 | Evans et al. ............. | 360/244.1 |
| 6,052,251 A | * | 4/2000 | Mohajerani et al. ..... | 360/78.05 |

OTHER PUBLICATIONS

Takaharu Idogaki et al., Characteristics of Piezoelectric Locomotive Mechanism for an In–Pipe Micro Inspection Machine. Six international Sysposium on Micro and human Science Aug. 1995. pp. 193–198.*

Tanner et al. Reliability of a MEMS Torsional Racheting Actuator. IEEE 01CH37167. 39 th Anual International Reliability Physys Symposium Sep. 2001. pp. 81–90.*

Takaharu Idogaki et al., Characteristics of Piezoelectric Locomotive Mechanism for an In–Pipe Micro Inspection Machine. Six international Sysposium on Micro and human Science Aug. 1995. pp. 193–198.*

Tanner et al. Reliability of a MEMS Torsional Racheting Actuator. IEEE 01CH37167. 39 th Anual International Reliability Physys Symposium Sep. 2001. pp. 81–90.*

Second International Conference on Intelligent Materials, Jun. 5–8, 1994 "Destruction Detection Techniques for Safety Piezoelectric Actuator Systems"—K. Uchino and H. Aburatani (pp. 1248–1256).

"Crack Growth Detection and Estimation of Depth by Monitoring Acoustic Emission Activity"—C. Li, R. Carballo, P. Kohlert, R.H. Davis, M. Trujillo, C. Levy, I.N. Tansel (pp. 909–914).

Vol. 76, No. 6 *Journal, Communication of the American Ceramic Society*, 1993 "Dynamic Observation of Crack Propagation in Piezoelectric Multilayer Actuators"—Atsushi Furuta (pp. 1615–1617).

SPIE vol. 2190, "Active Damage Mitigation in Composite Structure by Actuation of Piezoceramic Patches"—Abu S. Islam and Dr. Kevin C. Craig (pp. 611–622).

(List continued on next page.)

Primary Examiner—Walter E. Snow
Assistant Examiner—Vincent Q. Nguyen
(74) Attorney, Agent, or Firm—Faegre & Benson LLP

(57) ABSTRACT

A method for detecting failures in microactuator motors in head suspensions including exciting the head suspension at its natural resonant frequency, monitoring and evaluating the voltage produced by one or both piezoelectric elements in the motor, and comparing the voltage produced with one or more voltage waveforms corresponding to a properly functioning and mounted motor in response to a similar input. The method also includes applying a sweep frequency signal to provide visibility of a microcrack in the motor that may initially be concealed by plating on the motor.

30 Claims, 18 Drawing Sheets

OTHER PUBLICATIONS

Japanese Journal of Applied Physics, Vol 26 (1987) Supp. 26–2 "Acoustic Emission in Piezoelectric/Electrostrictive Actuators"—Kenji Uchino, Terukiyo Hirose and Ande Murali Varaprasad (pp. 167–170).

SPIE vol. 2715 "Constitutive and failure models for relaxor ferroelectric ceramics"—Craig L. Hom, Steve A. Brown and Natarajan Shankar (pp. 316–328).

Vol. 83, No. 3, *Journal, Communication of the American Ceramic Society*, Mar. 2000 "Differences in Tensile and bending Strength for Knoop–Cracked Lead Zirconate Titanate Specimens"—Theo Fett, Dietrich Munz and Gerhard Thun (pp. 669–671).

Ping Yeh et al., "PZT Crack Detection of Suspension Based Dual Stage Actuators", *IEEE Intermag Conference, Toronto, Canada, Apr. 9–13, 2000*, 1 page.

* cited by examiner

US 6,639,411 B1

MICROACTUATED SUSPENSION MOTOR FAILURE DETECTION SYSTEM

CROSS REFERENCE TO RELATED APPLICATIONS

This application claims the benefit of U.S. Provisional Application No. 60/230,029, filed Sep. 5, 2000, the entire contents of which are hereby incorporated by reference.

BACKGROUND OF THE INVENTION

Microactuated suspensions are generally known and disclosed, for example, in the Krinke et al. U.S. Pat. No. 6,046,888. FIG. 1 is an illustration of one such microactuated suspension 30. The embodiment shown in FIG. 1 has an actuator or motor 32 formed by a pair of piezoelectric (PZT) elements 34, 36 for rotating or otherwise driving a load beam 38 with respect to a baseplate 40 in response to electric drive signals. Piezoelectric materials are also widely used as transducers of mechanical motion into electrical energy.

The piezoelectric elements are typically mounted to the suspension by adhesive. Adhesive fractures sometimes develop during the manufacturing process. As a result of these fractures, the piezoelectric elements are not properly mounted to the suspension, and will not function properly. Fractures are also sometimes present in the piezoelectric elements themselves, and can also prevent the microactuator from functioning properly. Still other microactuator failures occur when the piezoelectric elements are depoled, when the elements are oriented or electrically interconnected with the same polarity, and when the bonds between the drive signal lead wires and the element terminals are broken.

Known testing approaches for identifying motor failures include resistance and stroke tests. There remains, however, a continuing need for improved motor failure test methods and associated systems. Methods and systems which are capable of being efficiently performed and which can accurately identify a wide range of failures would be particularly desirable.

DETAILED DESCRIPTION OF THE PREFERRED EMBODIMENTS

The present invention is based upon the recognition that a wide range of microactuator failure modes can be efficiently detected by causing relative movement between the suspension portions being driven with respect to one another by the motor 32, and monitoring and evaluating the electrical signals produced by the motor. The characteristics of the electrical signals (e.g., shapes and levels) produced by a motor having a failure mode are sufficiently different than those of a properly functioning motor that the operational state can be accurately assessed.

Figure 1:
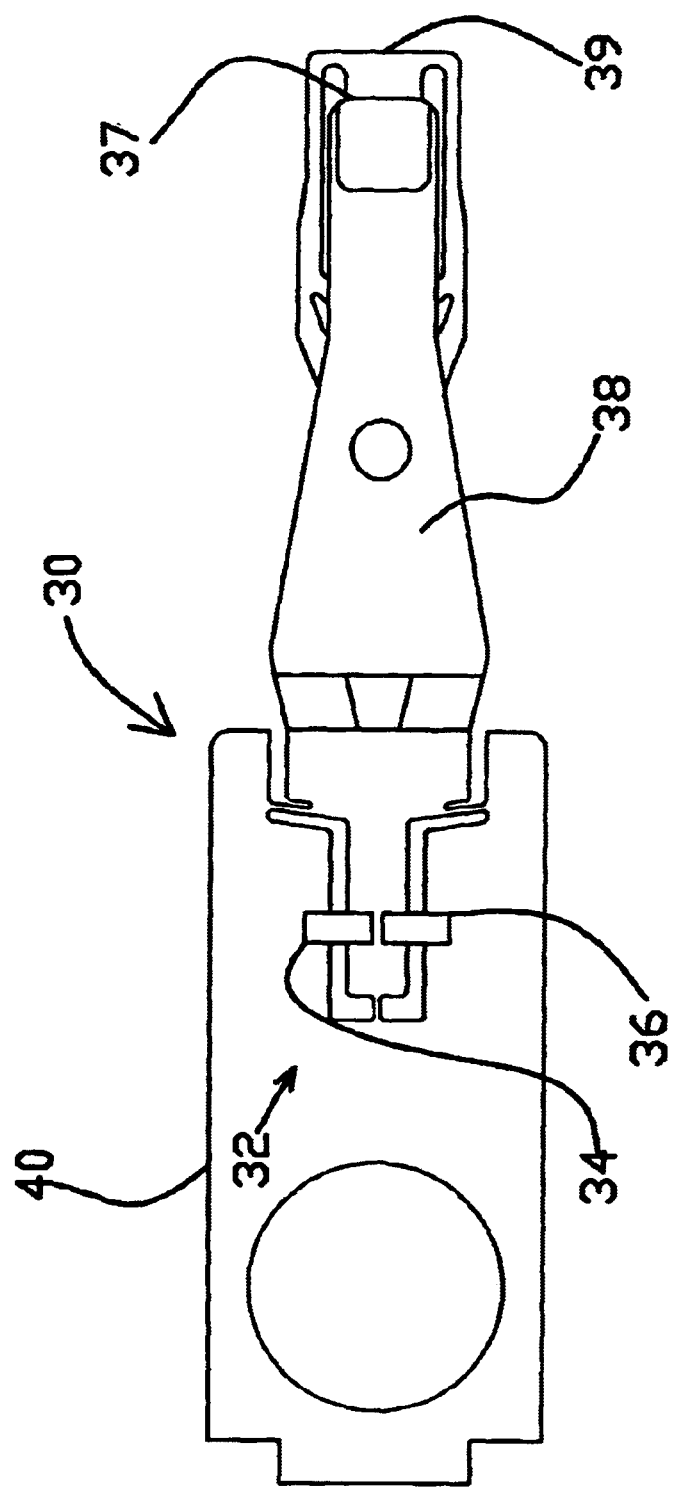
FIG. 1 is a simplified plan view of a head suspension having microactuator motors to which the present invention is directed.
Figure 2:
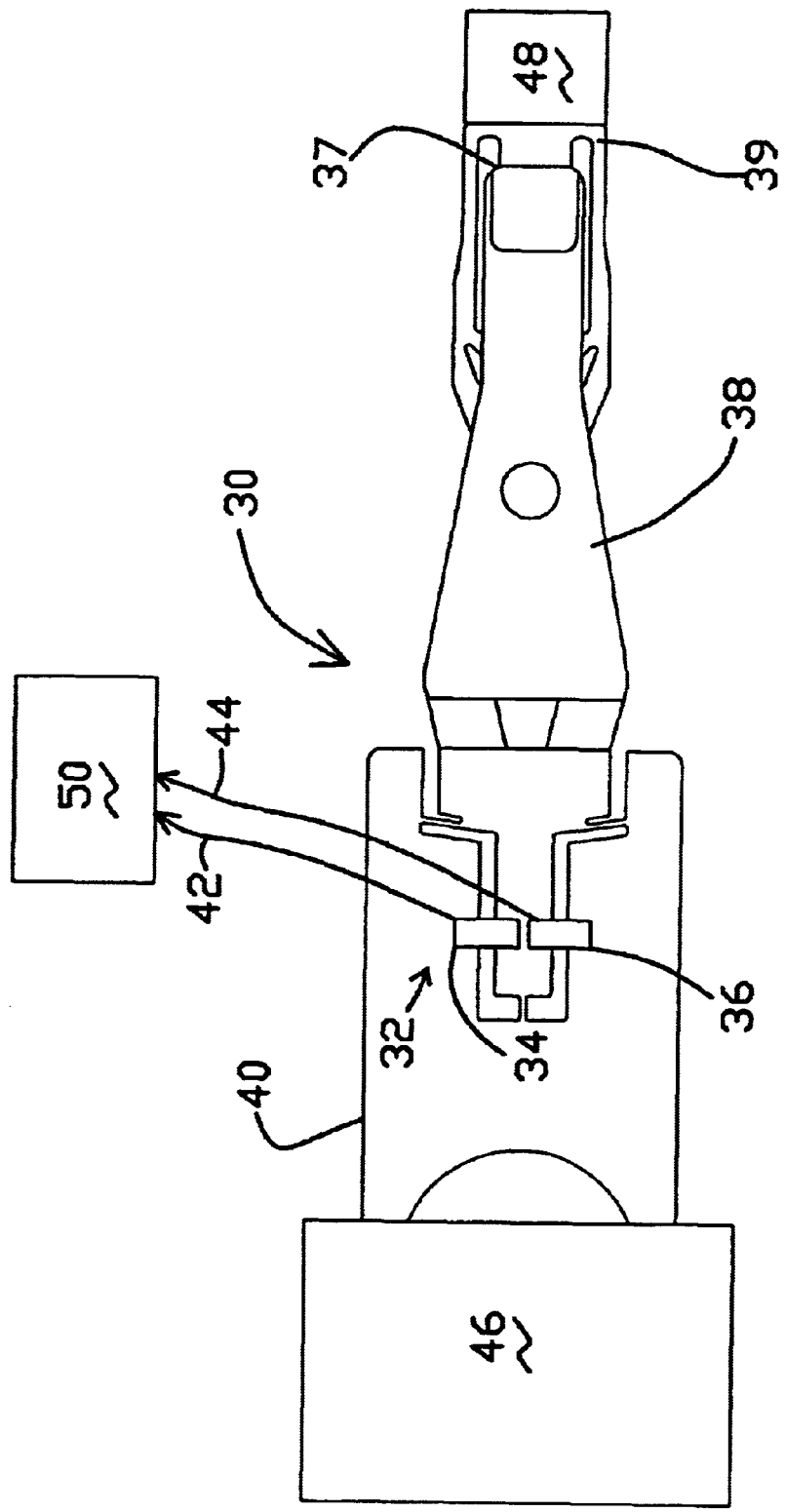
FIG. 2 is a schematic illustration of a microactuated suspension, together with a motor failure detection system according to the present invention.

The suspension design shown in FIGS. 1 and 2 includes two PZT elements 34, 36 that act as the motor 32 and provide fine adjustment of a read/write head 37. It is to be understood that the motor region 32 is the area on the suspension where the PZT elements 34, 36 are bonded. Damage to the motor region causes changes in the suspension's structural characteristics. An electrical charge is created by applying stress to the PZT elements 34, 36. The method of the present invention, referred to as the "ringout" method, applies stress to the motor region 32 containing the PZT elements 34, 36 and monitors the resultant voltage across nodes 42, 44. If the motor region 32 has a defect, the output voltage changes depending on the failure mode. In the design shown in FIGS. 1 and 2, the PZT elements 34, 36 carry a small percentage of the suspension gram load.

Ringout is a test method that may be used to detect motor structure damage such as adhesive delamination, broken wire bonds, depoled motors and some types of PZT fractures. One such type of fracture is a "hairline crack" i.e., a crack that permeates the top gold layer of a PZT element and can be enlarged by subjecting the top gold layer to a tensile stress. In contrast, as used herein, it is to be understood that a "microcrack" is a crack that does not permeate the top gold layer of the PZT element and cannot be observed by eye or microscope at any magnification even if the PZT element is stressed.

FIG. 2 is a schematic illustration of a microactuated suspension and a "ringout" motor failure detection system in accordance with the present invention. As shown, the motor failure detection system generally includes a clamp 46, a motion actuator 48 and a signal processing system 50. The suspension baseplate is clamped to a datum or fixed location by the clamp 46. The motion actuator 48 engages a headlift (not shown) or other component of the load beam 38 or flexure 39 and raises or lowers (e.g., moves) the load beam 38 with respect to the baseplate 40 (within its range of elastic deformation). The motion actuator 48 then releases the load beam 38 or flexure 39, thereby allowing the load beam to vibrate in a periodic manner at its natural frequency. The clamp 46 and motion actuator 48 of this embodiment of the invention thereby cooperate to cause relative movement between the suspension portions that are being driven with respect to one another by the piezoelectric elements 34, 36 of the motor 32.

Figure 3A:
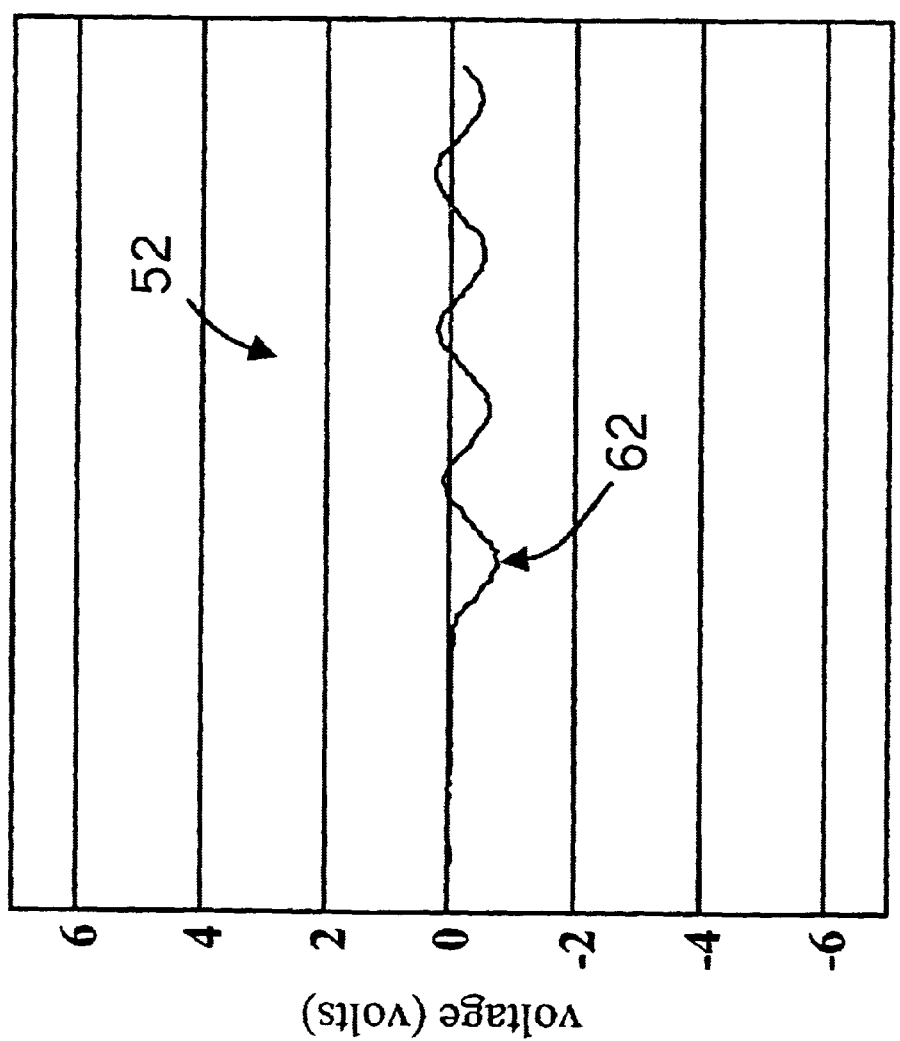
FIG. 3a is an output waveform of a good part.
Figure 3B:
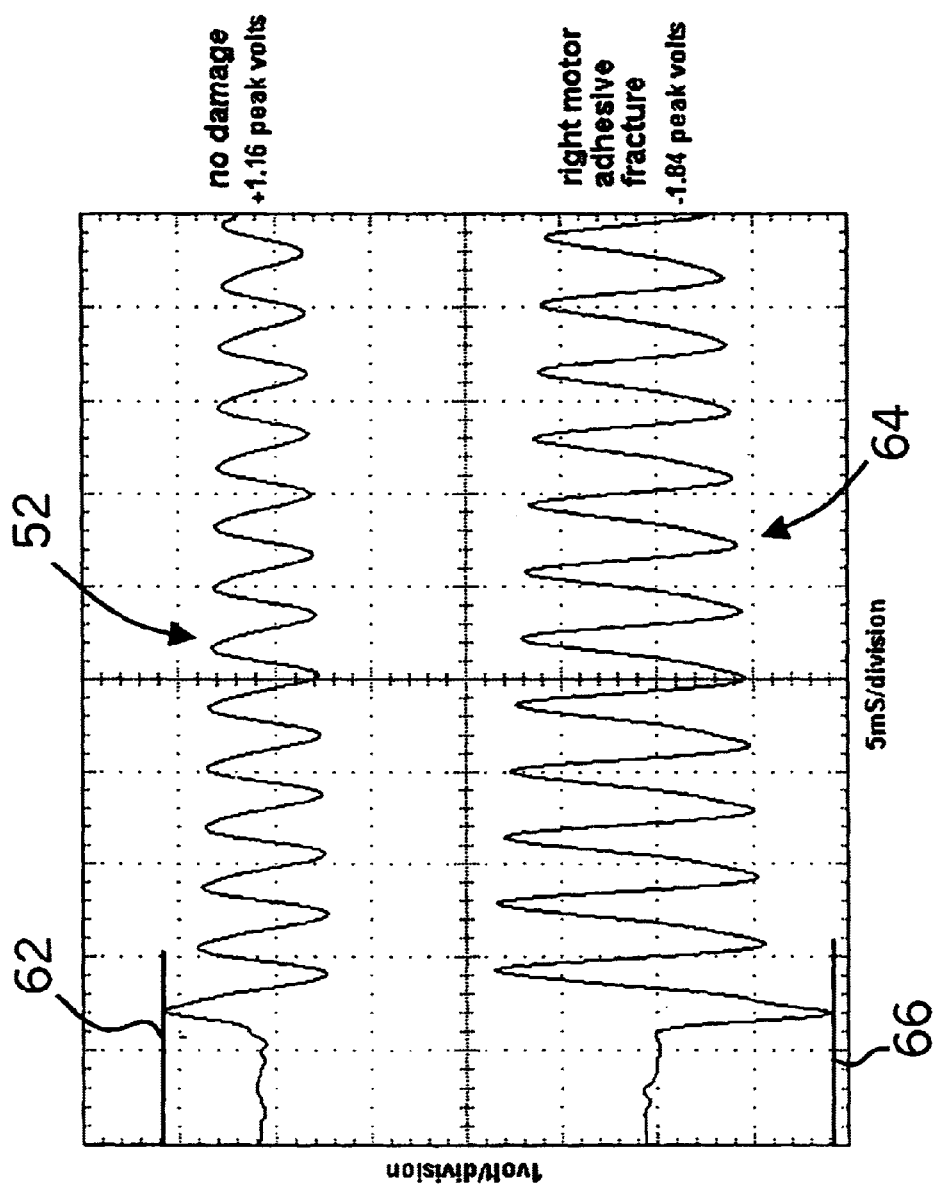
FIG. 3b is a graph of electrical signals produced by a properly functioning and mounted microactuator motor and a motor having an adhesive fracture.
Figure 3C:
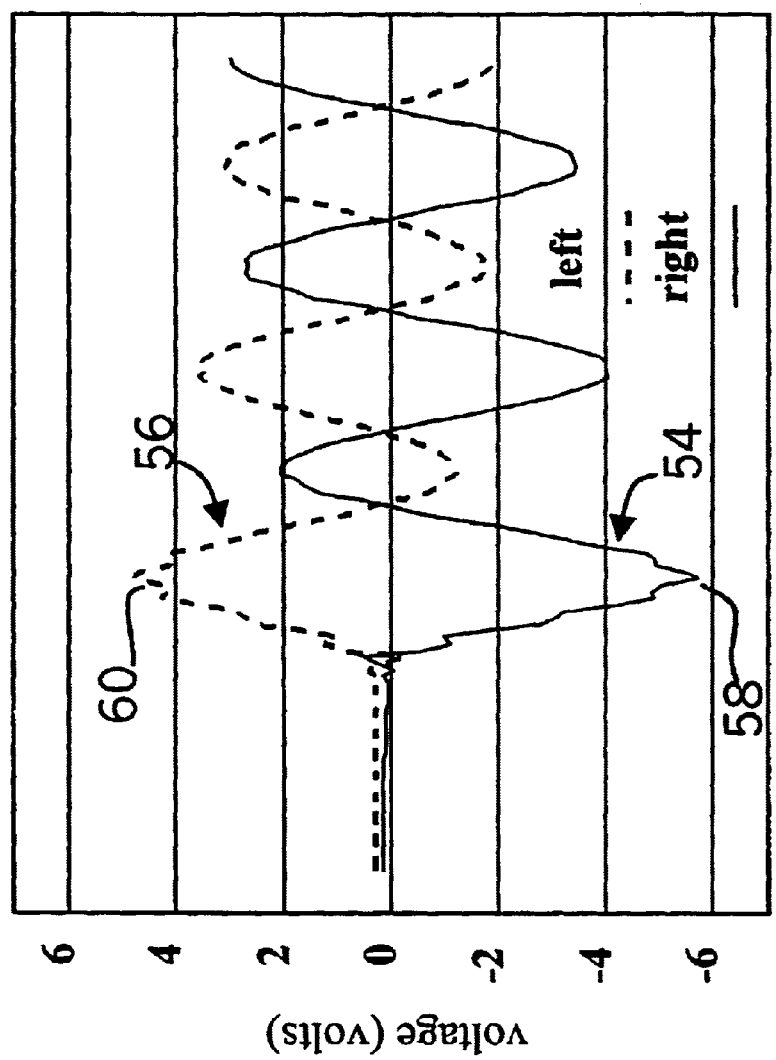
FIG. 3c is an output waveform of a part with the wire disconnected between the motors.

Referring to FIGS. 3a and 3b, as well as to FIG. 2, the electrical signal(s) produced by the motor in response to the movement on lines 42, 44 are monitored and evaluated by the signal processing system 50 to provide information representative of motor failure modes. Another embodiment of the invention (not shown) includes a motion actuator which engages a headlift on the suspension, and raises the suspension to its fly height before releasing the suspension and allowing the suspension to vibrate. The ringout method of the present invention takes advantage of this condition by applying stress to the PZT elements 34, 36 by lifting the part to flyheight while holding the base plate 40 stationary using a clamp 46. The part is then released, and the suspension 30 is allowed to freely resonate about its bending mode. The suspension design shown has the two PZT elements or motors 34, 36 connected in parallel. The voltage 52 measured at the trace is the sum of the voltages from the individual motors. Since the motors are poled in opposite directions, bending stresses will produce opposite charges on each motor. This electro-mechanical relationship is illustrated in FIG. 3c by disconnecting the wire between the two motors and displaying the output waveforms 54, 56 from each simultaneously as the part is tested. In this example, the peak voltage 58 from the right motor is approximately −5.7 v, compared to +4.9 v for the left motor peak voltage 60, as shown in FIG. 3c. The differing peak voltages are due to the fact that more stress is applied to the right motor because of the asymmetrical characteristics of the design, which is caused by the flexure being attached to one side of the suspension as opposed to being attached to the center of the part. When the load beam 38 is lifted to flyheight, stress is applied to both motors. A motor region failure mode, such as a cracked PZT motor or adhesive delamination, will change the applied stress in relation to the size and location of the fracture. The change in stress causes a proportional change in peak output voltage, which indicates the part is defective.

Returning to FIGS. 3a and 3b, the voltage waveform 52 of the PZT elements during a ringout test of a good part may be seen at two magnification levels. The first peak voltage 62 is used to determine if a defect exists; however, the entire waveform 52 provides additional information about the failure mode and may be used for that purpose. Note that the fundamental frequency for a good suspension (of the type shown) at free state is approximately 315 Hz in FIG. 3a and the first peak voltage measures −0.8 v (+/−0.2 v). A digitizing oscilloscope is connected to the PZT elements 34, 36 via the suspension trace and a 10× oscilloscope probe. A rigid shim holds the part at flyheight. The shim is removed from the part and the suspension 30 is allowed to resonate in bending. If possible, the headlift feature on the part is used to elevate the part to flyheight. However, if no headlift exists extreme care is taken to both elevate the part on the flexure 39 and to release the part by removing the shim from the flexure 39.

FIG. 3b is an inverted and expanded scale graph of the electrical signals produced by a properly functioning and mounted microactuator motor ("no damage") at waveform 52. FIG. 3b also shows a waveform 64 for a motor having an adhesive fracture on one of its piezoelectric elements ("right motor adhesive fracture"). As shown, the peak level 62 of the signal produced by the properly functioning motor is relatively low compared to the peak level 66 of the motor having the failure mode.

Figure 4:
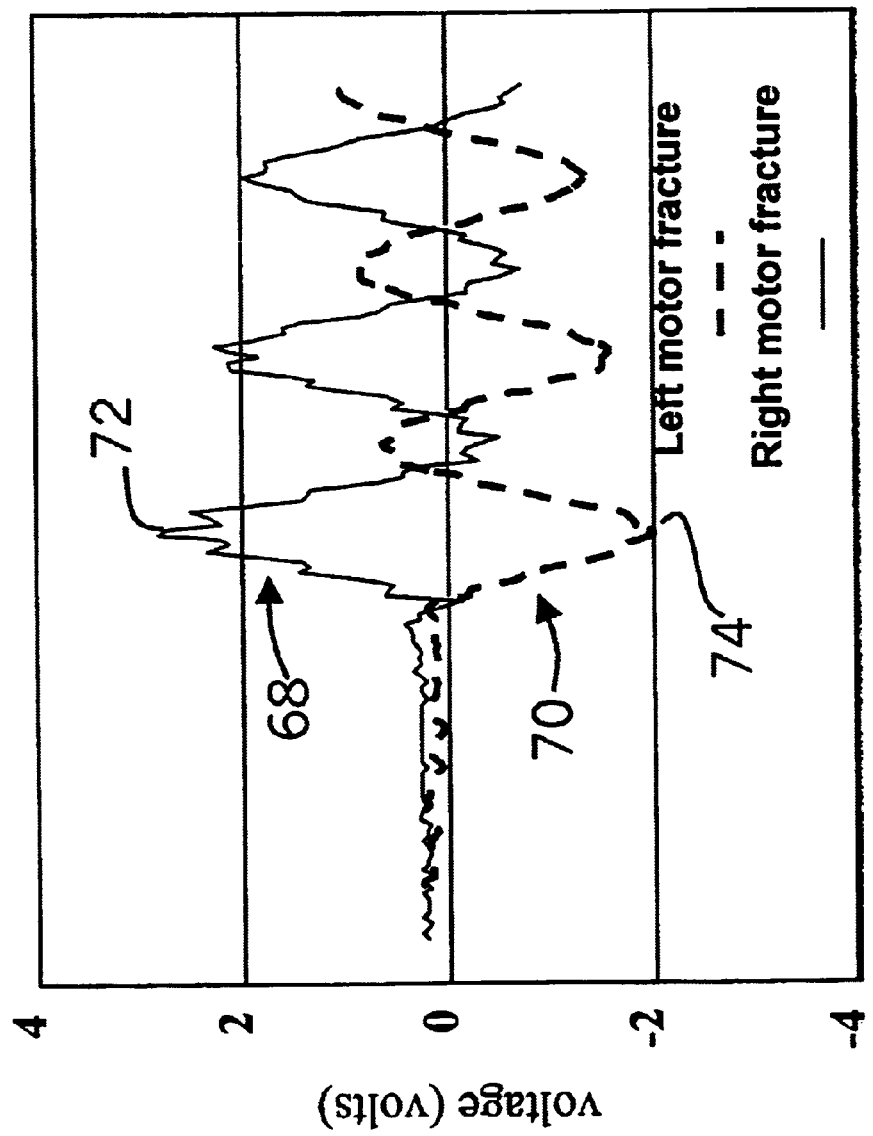
FIG. 4 shows the output waveforms for a suspension with a right and a left motor fracture.

FIG. 4 shows the output waveforms 68, 70 for a suspension with a right and left motor fracture. A right motor fracture produces a positive peak voltage 72 indicating the right motor is generating less voltage than normal. Adhesive delamination of the of the right motor will produce a similar output waveform and peak voltage. The output waveform 70 for a left motor fracture produces a negative peak voltage 74 indicating the left motor is generating less voltage than normal. Note that the peak voltages for both a left and right motor fracture are outside the range of voltages observed for parts with no defects, which is −0.8+/−0.2 v. Adhesive delamination of the left motor will produce a similar output waveform and peak voltage.

Figure 5:
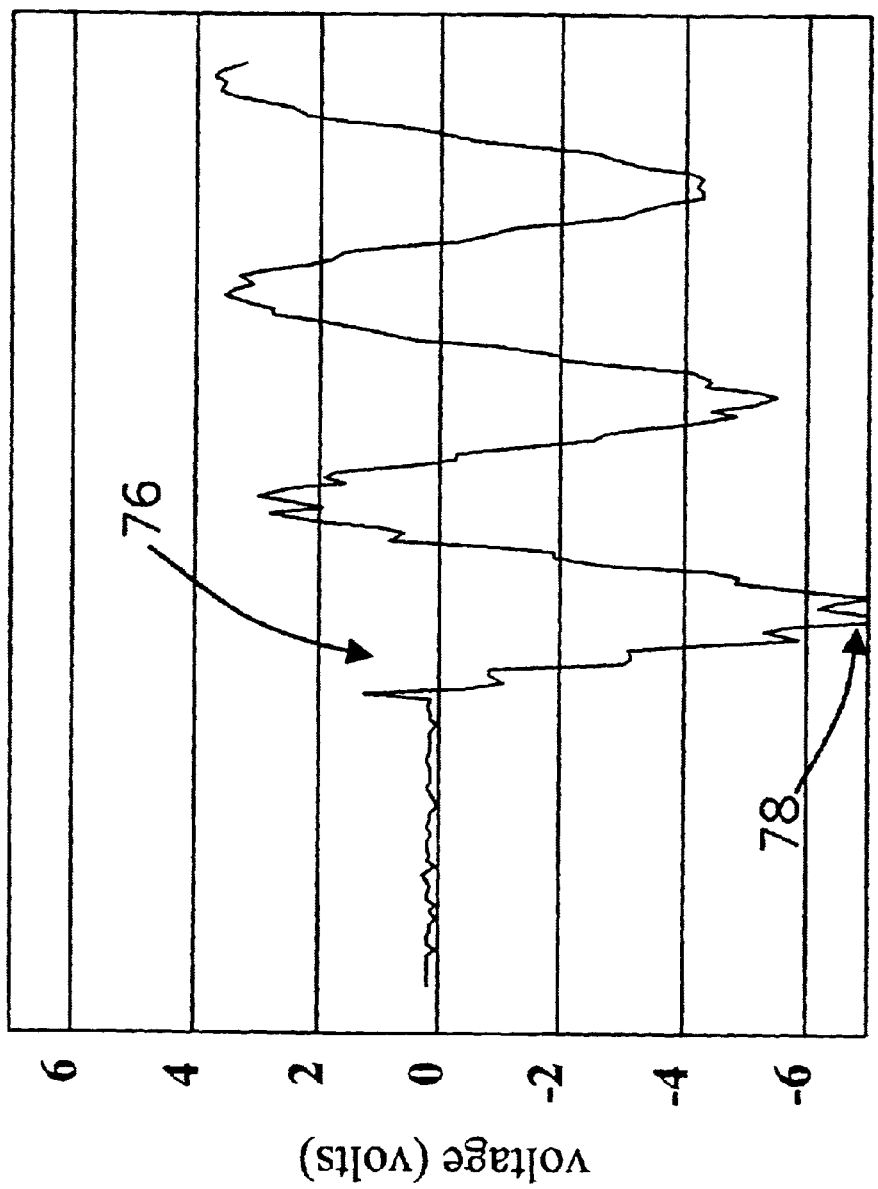
FIG. 5 shows the output waveform for a suspension that has a broken wire bond between the motors.

FIG. 5 shows an output waveform 76 of a suspension that has a broken wire bond between the motors. An electrical connection remains between.the trace and the right motor; hence, a resultant peak voltage 78 is similar to the result 58 shown in FIG. 3c for the right motor.

Figure 6:
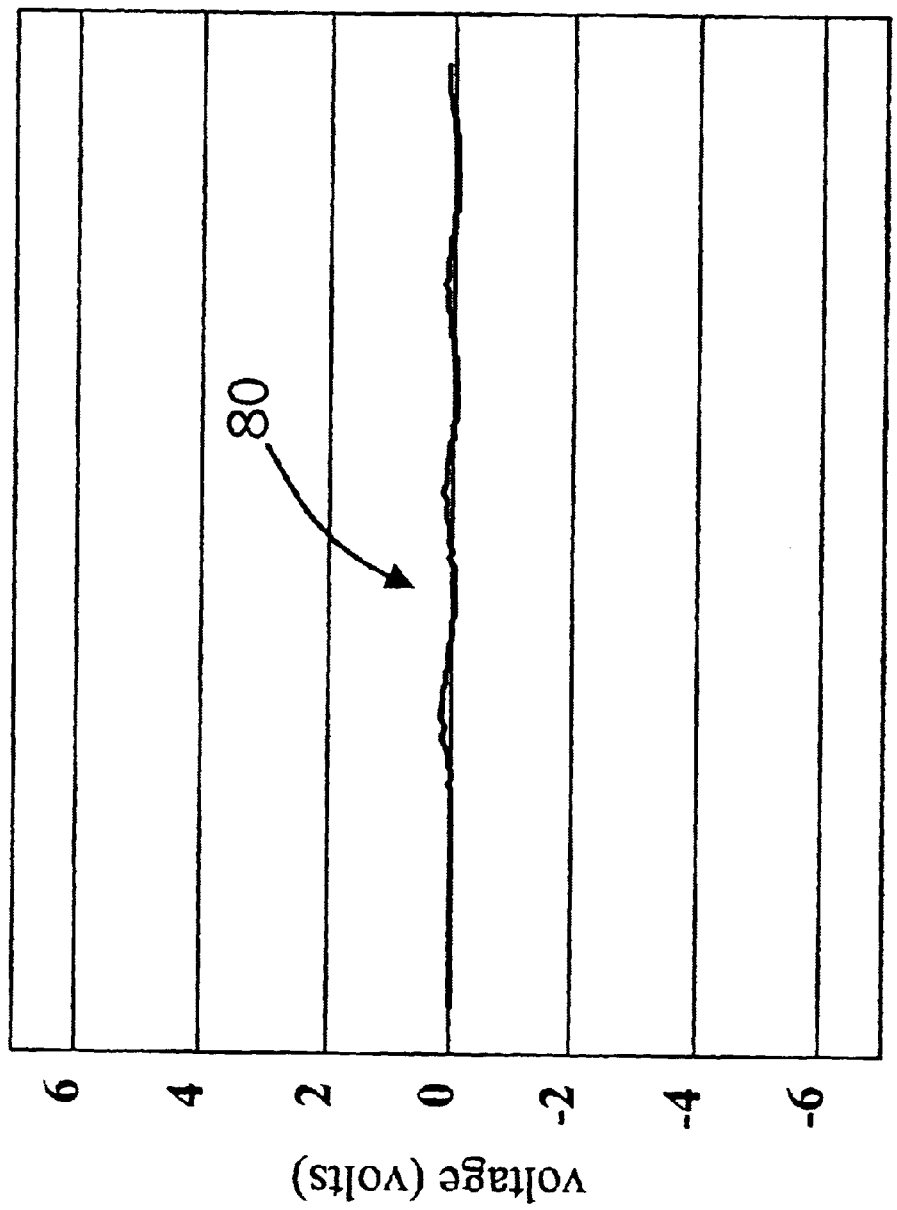
FIG. 6 shows the output waveform when both motors are depoled.

FIG. 6 shows an output waveform 80 when both motors are depoled. When PZT motors are depoled, they output a significantly lower voltage as the motors are flexed compared to PZT motors that are not depoled. Notice that the waveform 80 shows a significant reduction in peak voltage, which is easily detectable.

Figure 7:
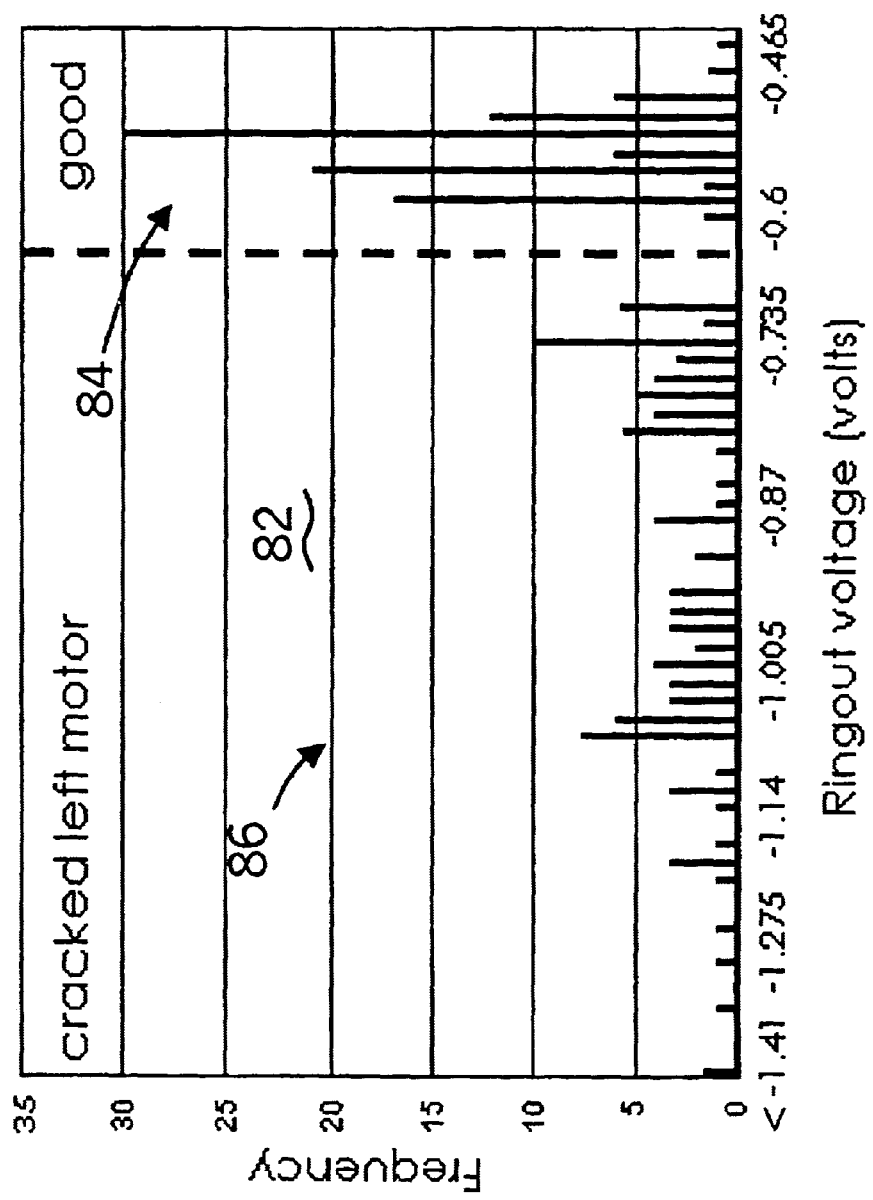
FIG. 7 is a histogram of good parts and parts with a cracked left motor.

FIG. 7 is a histogram 82 of good parts 84 and parts 86 with a cracked left motor which shows the separation/gap between the peak voltage of known good parts and the peak voltage of parts with a fractured left motor.

Figure 8A:
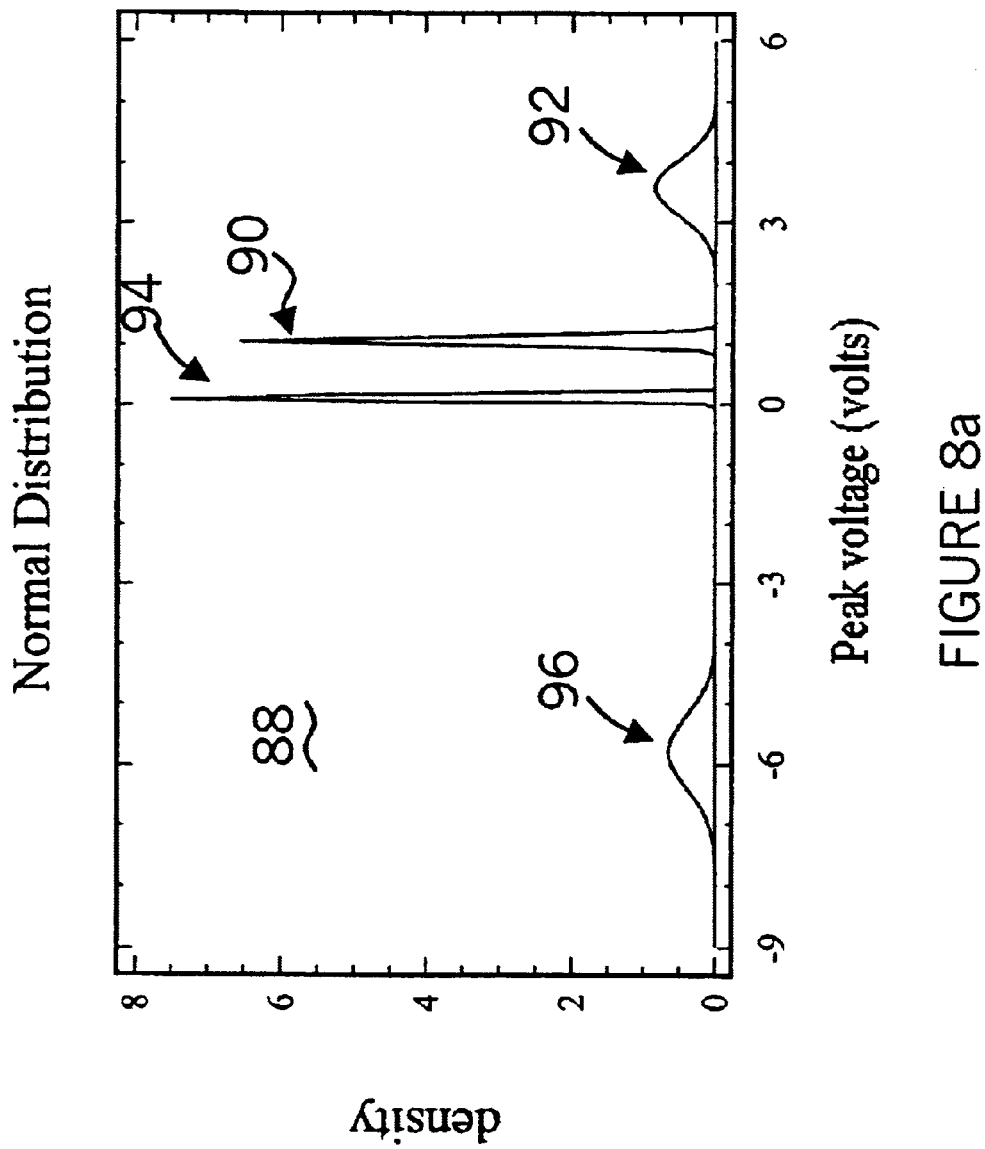
FIG. 8a is a graph in the form of a histogram of signal characteristics of microactuator suspension failure tests for properly functioning suspensions and for suspensions having different failure modes.

Testing has shown that the ringout method can reliably detect defects on this type of suspension. FIG. 8a is a graph of a histogram illustrating the number (density) of occurrences and signal characteristics of microactuated suspension failure tests in accordance with the invention for properly functioning ("good") suspensions (at 90) and suspensions having a number of different failure modes. The failure modes represented in FIG. 8a include motors having broken wire bonds (at 92), having depoled piezoelectric elements (at 94) and having elements that are poled the same (at 96). As shown, the peak signal distributions for the properly functioning and specific failure mode motors are relatively tight and distinguishable from one another. In particular, the peak signal level of good motors is at least about 1 volt (e.g., from "depoled" motors), and up to at least about 7 volts (from "poled same " motors), different in magnitude than the levels produced by the motors having the various failure modes. The mean and standard deviation for each of the distributions shown in FIG. 8a is listed in Table 1.

TABLE 1

| DISTRIBUTION | MEAN | STANDARD DEVIATION |
| --- | --- | --- |
| 90 | 1.05425 | 0.0605694 |
| 92 | 3.57375 | 0.468772 |
| 94 | 0.10655 | 0.0367325 |
| 96 | −5.808 | 0.613837 |

Figure 8B:
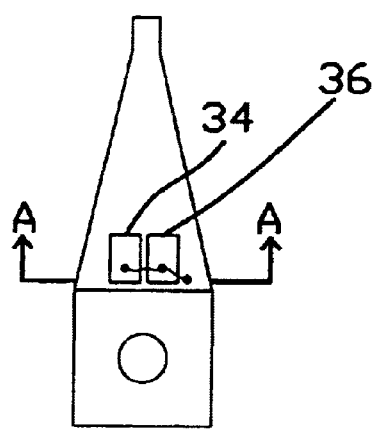
FIG. 8b is a key for FIGS. 8c–8e.
Figure 8C:
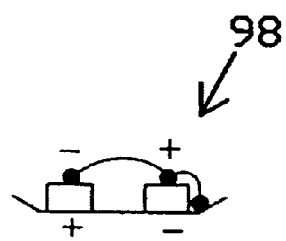
FIG. 8c shows a section view along line A—A of FIG. 8b with a wire 98 for a normal part.
Figure 8D:
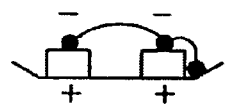
FIG. 8d shows a section view along line A—A of FIG. 8b for motors poled the same.
Figure 8E:
FIG. 8e shows a section view along line A—A of FIG. 8b for motors with a broken wire bond.

FIG. 8b is a key to FIGS. 8c–8e. FIG. 8c shows a section view along line A—A of FIG. 8b with a wire 98 for a normal part. FIG. 8d shows a section view along line A—A of FIG. 8b for motors poled the same, and FIG. 8e shows a section view along line A—A of FIG. 8b for motors with a broken wire bond.

Figure 9:
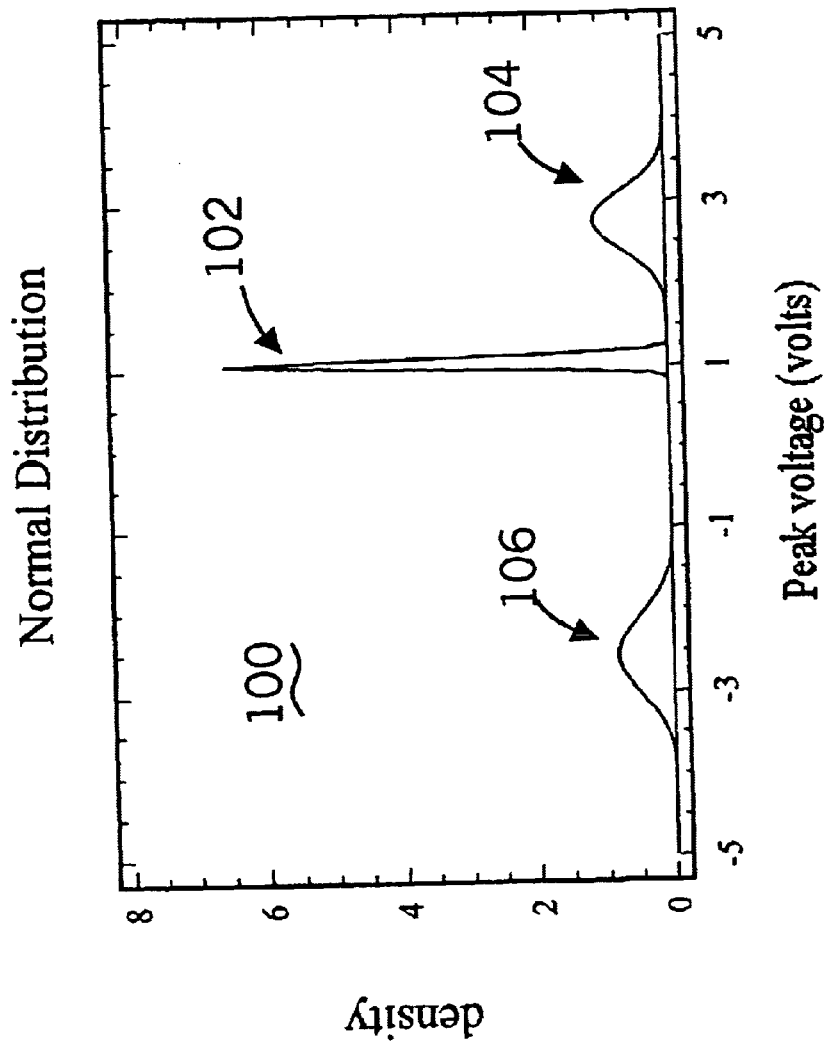
FIG. 9 is a graph in the form of a histogram of signal characteristics of microactuator suspension failure tests for properly functioning suspensions and for suspensions having fractures in one of the piezoelectric elements.

FIG. 9 is a graph of a histogram illustrating the number (density) of occurrences and signal characteristics of microactuated suspension failure tests in accordance with the invention for properly functioning ("good") suspensions and suspensions having motors with fractures in one of either the left or right piezoelectric elements. Distribution 102 is for good parts, distribution 104 is for parts with an adhesive fracture at the left motor, and distribution 106 is for parts with an adhesive fracture at the right motor. The mean and standard deviation for each of these distributions is shown in Table 2.

TABLE 2

| DISTRIBUTION | MEAN | STANDARD DEVIATION |
| --- | --- | --- |
| 102 | 1.05425 | 0.0605694 |
| 104 | 2.762 | 0.365921 |
| 106 | −2.562 | 0.473926 |

Figure 10:
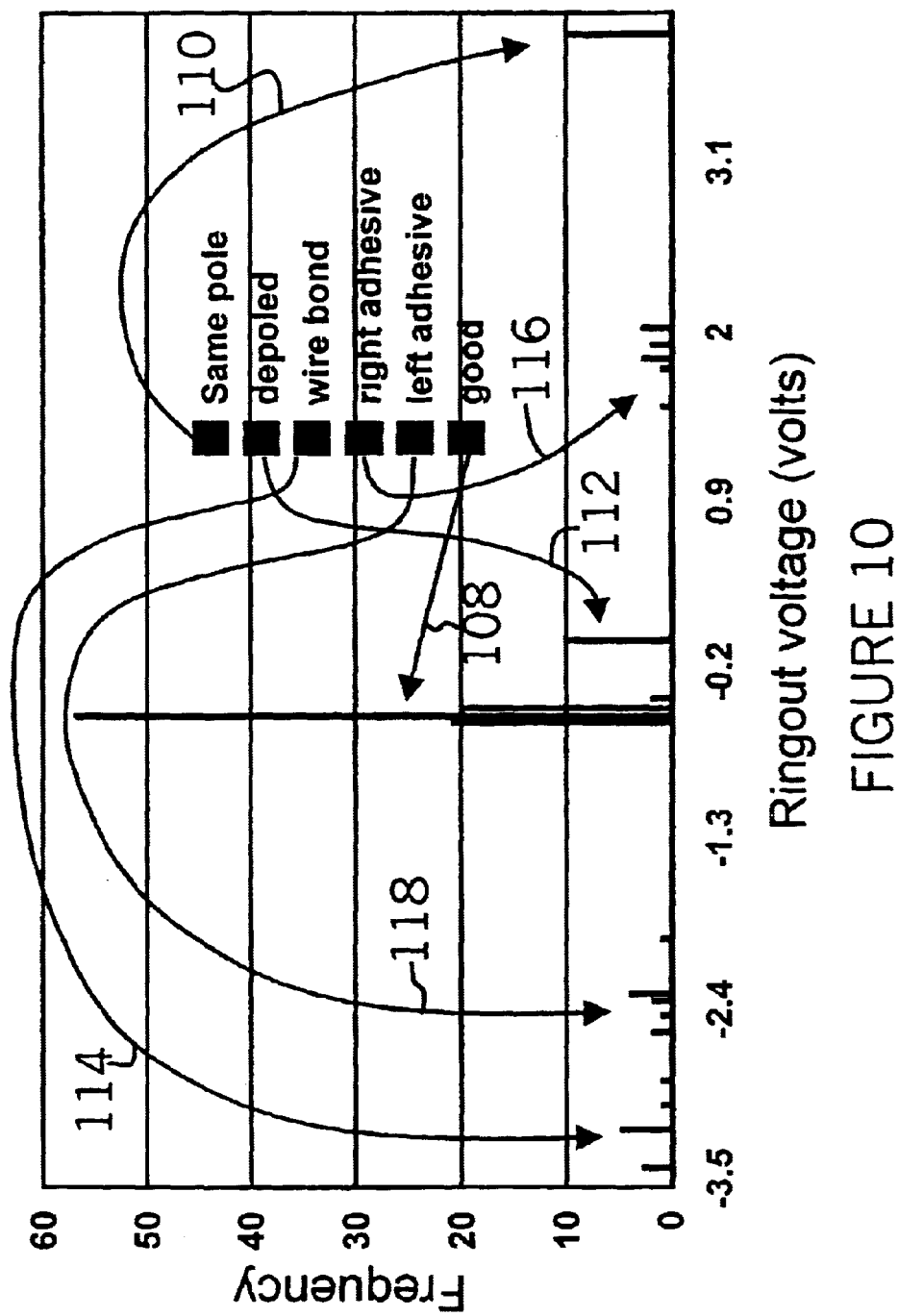
FIG. 10 is a histogram of good parts and parts with various other defects.

Referring now to FIG. 10, the separation between known good parts 108 and those with additional defects that the ringout method can detect may be seen. It is to be understood that the data for FIG. 10 has a sign change because the data for FIG. 10 was taken from a suspension intended for operation on the opposite side of a rotating magnetic disk. Furthermore, magnitude of the data for FIG. 10 differs from the data in FIGS. 8a and 9 because the data for FIG. 10 was taken from a different model of suspension than that tested for FIGS. 8a and 9. Nevertheless, it can be seen that discrete, identifiable defects include "same pole" 110, depoled parts 112, broken wire bonds 114, right motor adhesive failure 116 and left motor adhesive failure 118.

Figure 11:
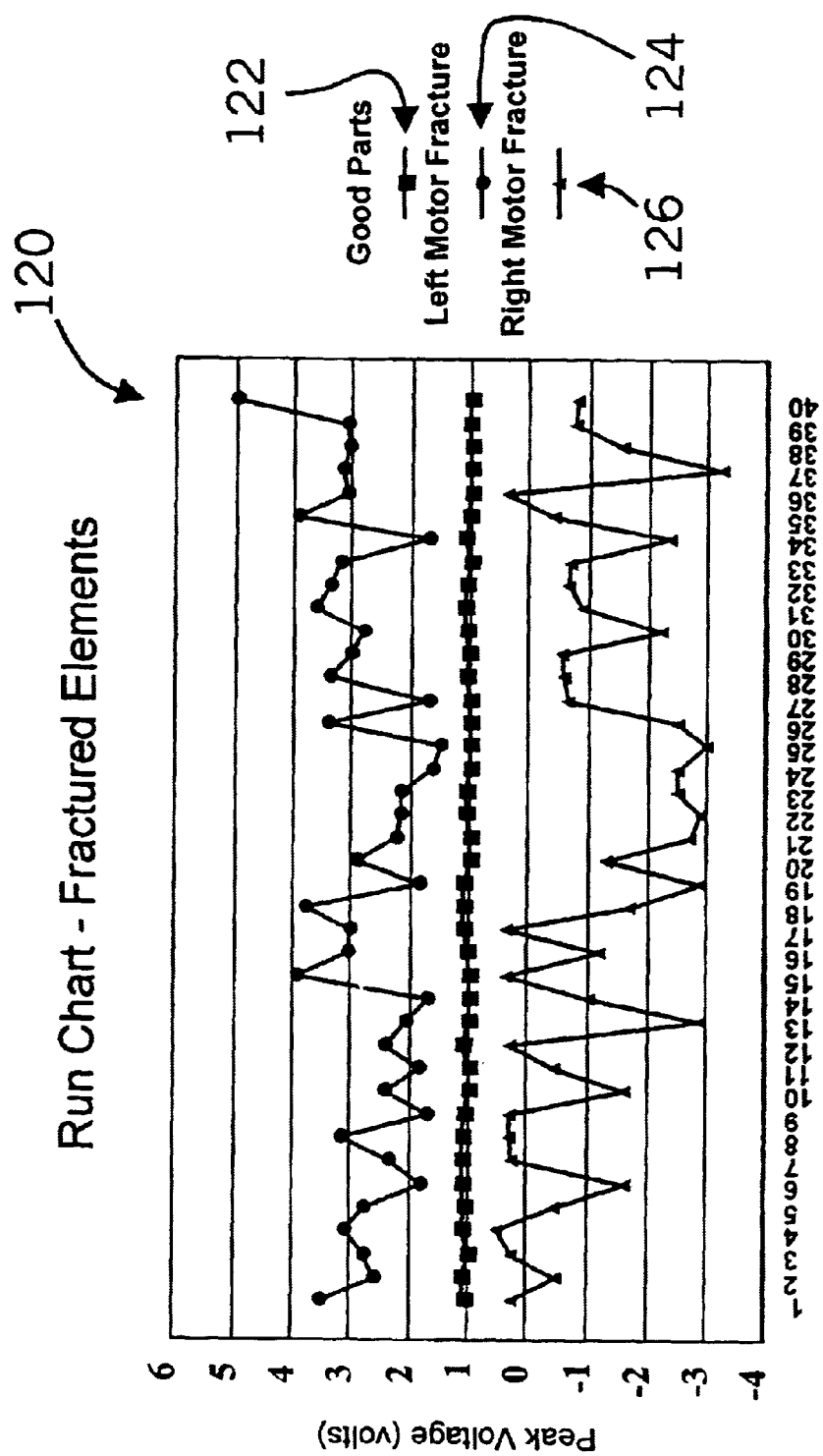
FIG. 11 is a graph of signal levels from a series of tested components, some of which are properly functioning, and some of which have fractures in either a left or a right piezoelectric element.

FIG. 11 is a graph 120 illustrating the signal levels from a series of tested components which are properly functioning ("good parts"), or have fractures in either the left or right piezoelectric element of the motor. Good parts are indicated by a square 122, left motor fracture parts by a diamond 124, and right motor fracture parts by a triangle 126.

Figure 12:
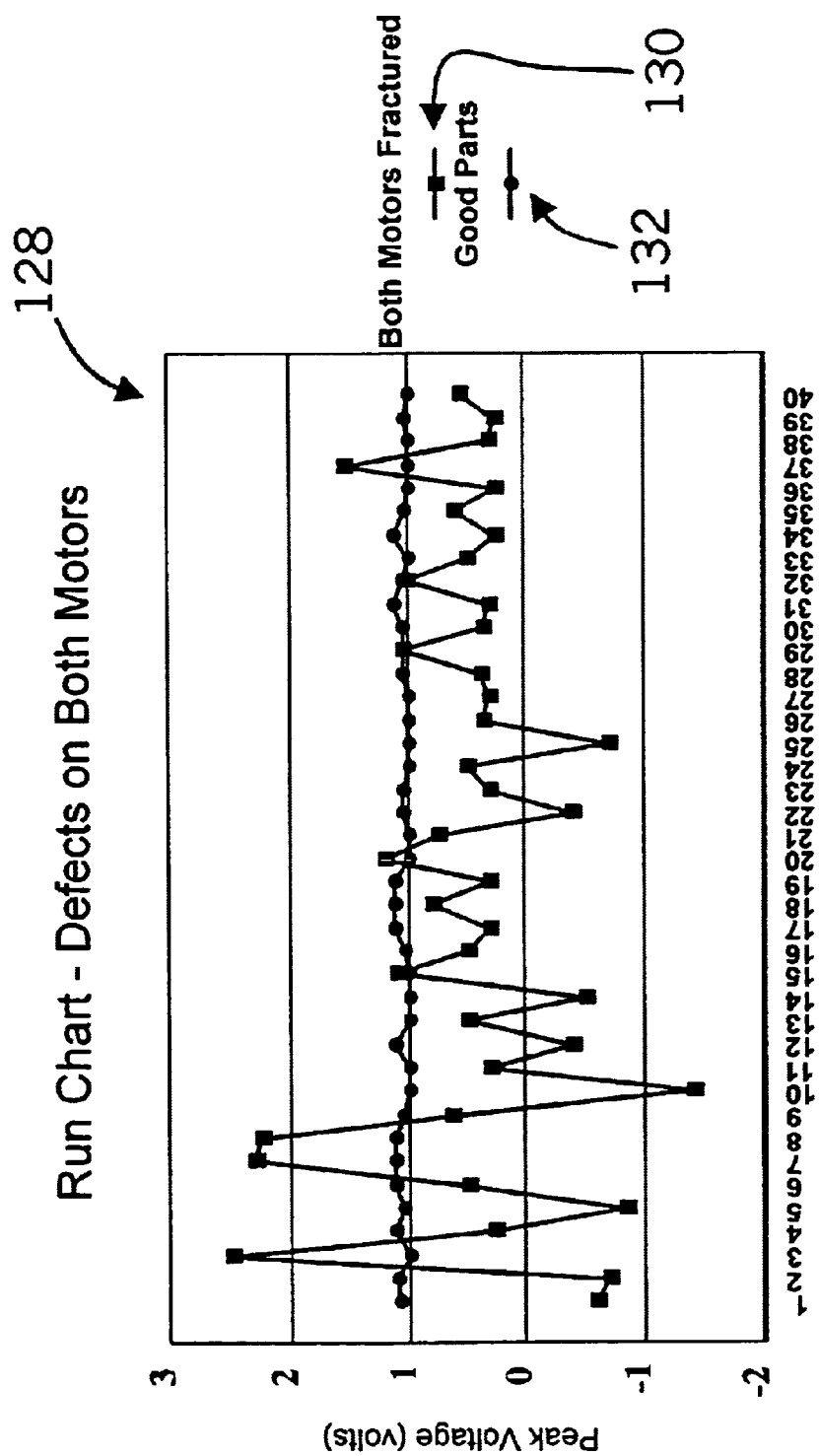
FIG. 12 is a graph of signal levels from a series of tested components, some of which are properly functioning, and some of which have fractures in both piezoelectric elements.

FIG. 12 is a graph 128 illustrating the signal levels from a series of tested components which are properly functioning ("good parts" indicated by a square 130), or have fractures in both piezoelectric elements of the motor (indicated by a diamond 132).

Figure 13:
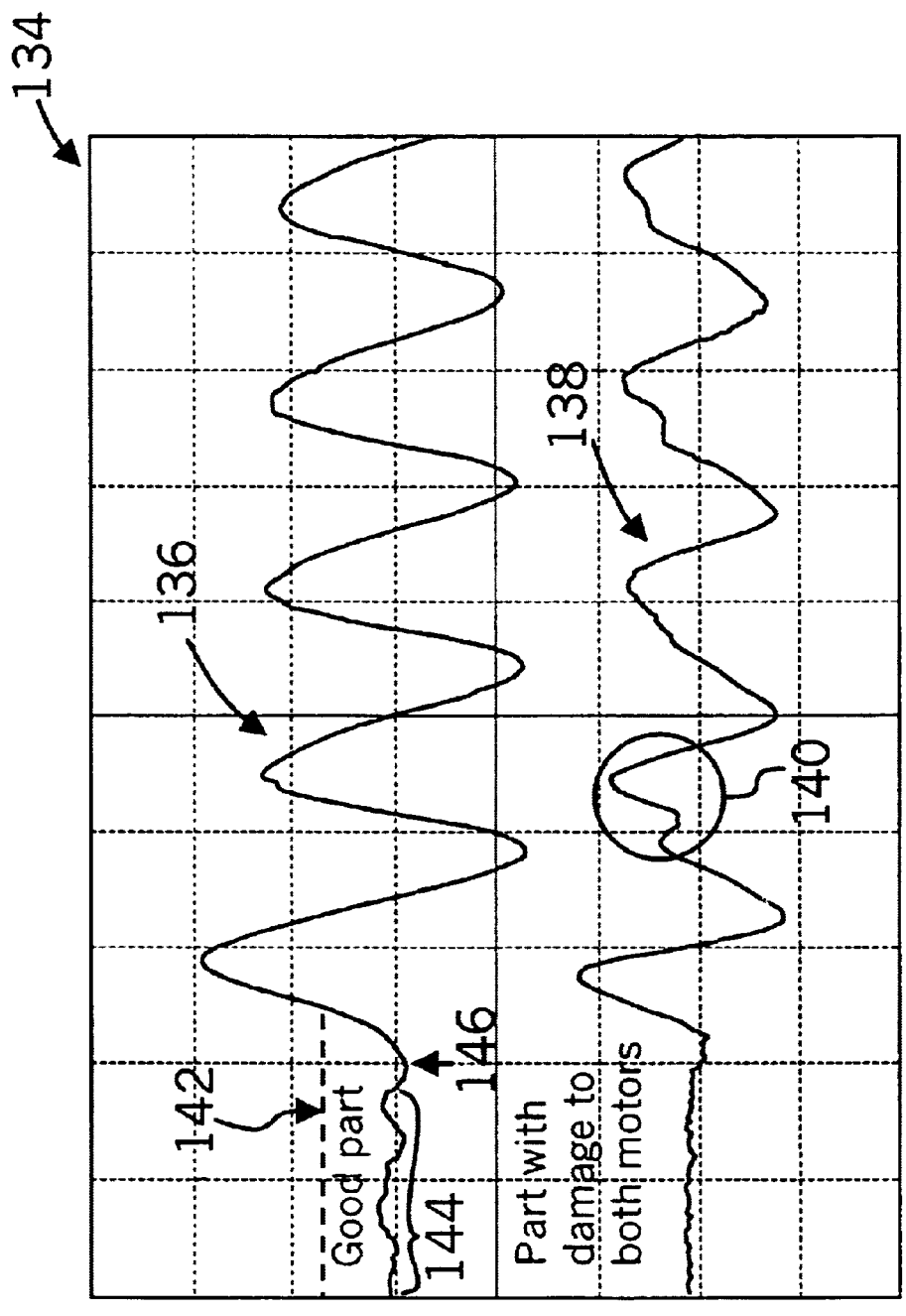
FIG. 13 is a graph of electrical signals produced by a properly functioning and mounted microactuator motor and a suspension motor having failure modes in both piezoelectric elements.

FIG. 13 is a graph 134 illustrating the signal levels from a properly functioning suspension motor (at 136) and a suspension motor having failure modes in both its piezoelectric elements (at 138). As shown, in addition to the signal levels, the shape characteristics of the signal from the damaged motor (i.e., asymmetric, not a sine wave) are also sufficiently different than the shape characteristics of the signal from the properly functioning motor to enable detection of the failure mode by a comparison of the signals (e.g., electronically or visually). As indicated by circle 140, the waveform 138 can show a bad part even if the peak voltage does not. It is to be noted that with respect to waveform 136 for a good part, the oscilloscope trigger was set at level 142. Waveform 136 displays noise 144 until the part is released at 146.

Microcracks

Turning to another type of failure, at this time, parts with micro cracks are not detectable using the ringout method alone. However, a method has been found to detect micro cracks by subjecting the motors to a high voltage electrical signal at a resonant frequency of the suspension (sway mode). The part must be rigidly held at the base plate with the suspension in an unloaded state. The vibration (actuation) created by this procedure causes the crack to propagate into a large fracture which is easily detectable. Investigation will determine effects of applying a high voltage sweep on PZT elements and the suspension assembly.

Tests have demonstrated that hairline and microcracks (i.e., very fine cracks) in the piezoelectric actuators can produce electrical signal characteristics which fall within the normal distribution of properly functioning motors. Cracks of these types typically extend through the gold layer, but are not visible under low magnification (e.g., 10×) unless the load beam is flexed. Microcracks located under the gold layer are generally not visible under any magnification, even if the load beam is flexed. However, very fine cracks of these types can be propagated into larger cracks which can be more accurately detected by the invention by applying a relatively large sweep frequency sine wave signal to the motor for a relatively short time period. The frequency range of the signal sweep preferably extends through at least one of the resonant frequencies of the suspension. As the suspension resonates, the very fine cracks will increase in size and propagate through the gold coating layer on the piezoelectric element. Arcing also occurs along the crack on the gold surface, thereby making the crack visible under low magnification. By way of example, tests of the invention have been performed by applying a 90 volt peak, 7 KHz–9 KHz sweep frequency sine wave of 750 msec duration. Although this signal is larger than the typical PZT motor operating voltage, it does not damage the PZT motor or the suspension (other than propagating existing cracks).

Figure 14:
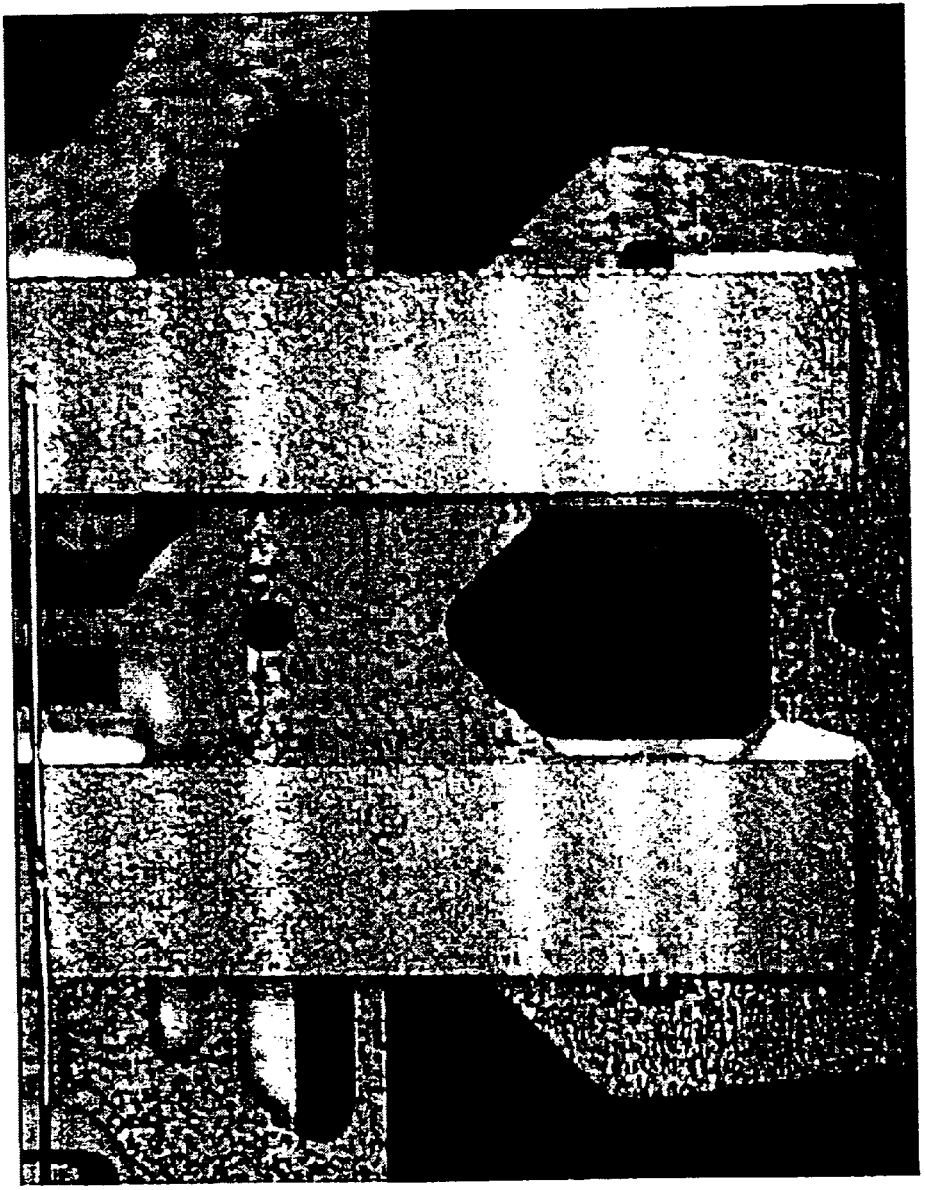
FIG. 14 is a photograph of the piezoelectric elements of a suspension microactuator motor having a microcrack (not visible) before application of a sweep frequency signal in accordance with a certain aspect of the present invention.
Figure 15:
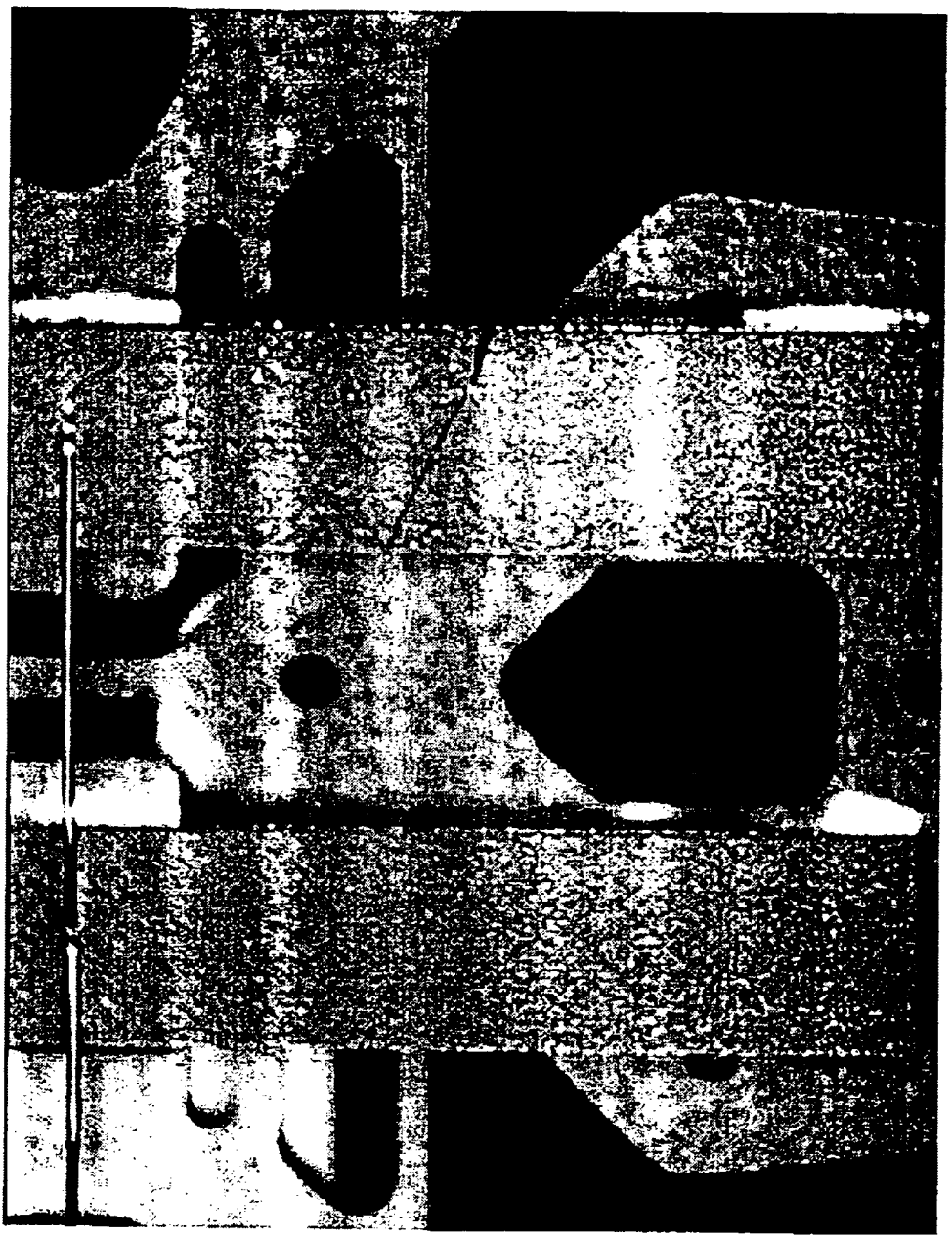
FIG. 15 is a photograph of the motor of FIG. 9 after application of a crack-expanding sweep frequency signal.

Following the application of this excitation signal, the suspension motor can be tested using the method described above. FIG. 14 is a photograph of the piezoelectric elements of a suspension microactuator motor having a microcrack (not visible) before application of a sweep frequency signal in accordance with the method described above. FIG. 15 is a photograph of the motor shown in FIG. 14 after application of the crack-expanding sweep frequency signal, with the microcrack now visible through the gold surface of the motor.

Summary

The ringout test method can detect many types of structural damage to the PZT motors, such as a broken wire bond, delaminated adhesive bond, depoled motors, and some types of fractured motors. While micro cracks are not detectable by this method alone, there is a method to use in conjunction with ringout that has the ability to detect micro cracks. Table 3 lists the defects and change in peak voltage from a known good part, illustrating the significance of the methods of the present invention.

TABLE 3

| Defect | Characteristics |
| --- | --- |
| Right motor - micro crack | No change |
| Left motor - micro crack | No change |
| Right motor - hairline fracture | 30% to 450% change |
| Left motor - hairline fracture | 60% to 250% change |
| Right motor - large fracture | 150% to 500% change |
| Left motor - large fracture | 60% to 400% change |
| Right motor - adhesive delamination | 350% to 600% change |
| Left motor - adhesive | 200% to 400% change |
| Broken wire bond | 300% to 800% change |
| Both motors depoled | 80% to 130% change |

What is claimed is:

1. A method for detecting failure in a head suspension having a microactuator motor with at least one piezoelectric element, the method comprising:
   a) using a motion actuator separate from the suspension to cause relative movement between the suspension portions drivable with respect to one another by the piezoelectric element; and
   b) monitoring and evaluating an electrical signal produced by the piezoelectric element including detecting failures from at least one of adhesive fractures, motor fractures, poling failures and broken wire bonds.

2. The method of claim 1 wherein step b) includes monitoring the voltage signal produced by the piezoelectric element.

3. The method of claim 1 wherein step b) includes comparing the electrical signal produced by the piezoelectric element to information representative of an electrical signal produced by a properly functioning piezoelectric element in response to similar relative movement.

4. The method of claim 1 wherein step b) includes monitoring and evaluating the peak level of the signal.

5. The method of claim 1 wherein causing relative movement of the suspension includes causing periodic motion between the suspension portions.

6. The method of claim 1 wherein causing relative movement of the suspension includes causing natural frequency vibrations in the suspension.

7. The method of claim 1 wherein causing relative movement of the suspension includes engaging, moving and releasing one portion of the suspension with respect to another portion.

8. The method of claim 7 wherein causing relative movement of the suspension includes clamping a first portion of the suspension, and engaging, moving and releasing a second portion of the suspension with respect to the first portion.

9. The method of claim 1 further comprising the additional step of
   a0) applying a failure-increasing signal to the piezoelectric element to increase relatively small flaws, such as microcracks, before step a).

10. The method of claim 9 wherein applying the failure-increasing signal includes applying a sweep frequency signal to the piezoelectric element.

11. The method of claim 10 wherein the sweep frequency signal is moved from about 7 KHz to about 9 KHz.

12. The method of claim 11 wherein the sweep frequency signal is a sine wave voltage waveform.

13. The method of claim 12 wherein the sine wave voltage waveform has a peak voltage of about 90 volts.

14. The method of claim 10 wherein the sweep frequency signal is applied for a predetermined duration.

15. The method of claim 14 wherein the predetermined duration is about 750 milliseconds.

16. A method for detecting failure in a head suspension having a microactuator motor, the method comprising:
   a) using a motion actuator separate from the suspension to cause relative movement between the suspension portions drivable with respect to one another by the motor; and
   b) monitoring and evaluating an electrical signal produced by the motor including comparing the electrical signal produced by the motor to information representative of an electrical signal produced by a properly functioning motor in response to similar relative movement.

17. The method of claim 16 wherein step b) includes monitoring and evaluating the peak level of the signal.

18. The method of claim 16 wherein causing relative movement of the suspension includes causing periodic motion between the suspension portions.

19. The method of claim 16 wherein causing relative movement of the suspension includes causing natural frequency vibrations in the suspension.

20. The method of claim 16 wherein causing relative movement of the suspension includes engaging, moving and releasing one portion of the suspension with respect to another portion.

21. A method for detecting failure in a head suspension having a microactuator motor, the method comprising:
   a) using a motion actuator separate from the suspension to cause relative movement between the suspension portions drivable with respect to one another by the motor including clamping a first portion of the suspension, and engaging, moving and releasing a second portion of the suspension with respect to the first portion; and
   b) monitoring and evaluating an electrical signal produced by the motor.

22. The method of claim 21 wherein step b) includes monitoring and evaluating the peak level of the signal.

23. The method of claim 21 wherein causing relative movement of the suspension includes causing periodic motion between the suspension portions.

24. The method of claim 21 wherein causing relative movement of the suspension includes causing natural frequency vibrations in the suspension.

25. The method of claim 21 wherein causing relative movement of the suspension includes engaging, moving and releasing one portion of the suspension with respect to another portion.

26. A method for detecting failure in a head suspension having a microactuator motor, the method comprising:
   a) applying a sweep frequency signal for a predetermined duration to the motor to increase relatively small motor flaws, such as microcracks;
   b) using a motion actuator separate from the suspension to cause relative movement between the suspension portions drivable with respect to one another by the motor; and
   c) monitoring and evaluating an electrical signal produced by the motor.

27. The method of claim 26 wherein the sweep frequency signal is moved from about 7 KHz to about 9 KHz.

28. The method of claim 27 wherein the sweep frequency signal is a sine wave voltage waveform.

29. The method of claim 28 wherein the sine wave voltage waveform has a peak voltage of about 90 volts.

30. The method of claim 26 wherein the predetermined duration is about 750 milliseconds.

* * * * *